(12) United States Patent
Konishi et al.

(10) Patent No.: US 7,754,397 B2
(45) Date of Patent: *Jul. 13, 2010

(54) PHASE-SHIFT MASK, MANUFACTURING METHOD THEREOF AND MANUFACTURING METHOD OF SEMICONDUCTOR ELEMENT

(75) Inventors: Toshio Konishi, Tokyo (JP); Yosuke Kojima, Tokyo (JP); Satoru Nemoto, Tokyo (JP); Jun Sasaki, Tokyo (JP); Keishi Tanaka, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 204 days.

This patent is subject to a terminal disclaimer.

(21) Appl. No.: 11/812,062

(22) Filed: Jun. 14, 2007

(65) Prior Publication Data

US 2007/0269726 A1    Nov. 22, 2007

Related U.S. Application Data

(63) Continuation of application No. PCT/JP2005/022201, filed on Dec. 2, 2005.

(30) Foreign Application Priority Data

Dec. 15, 2004   (JP) ............................ 2004-363200

(51) Int. Cl.
  *G03F 1/00* (2006.01)
(52) U.S. Cl. ............................. 430/5; 716/19
(58) Field of Classification Search ............... 430/5, 430/311; 716/19, 21; 216/41, 47; 382/144
  See application file for complete search history.

(56) References Cited

U.S. PATENT DOCUMENTS

| 6,458,495 | B1 | 10/2002 | Tsai |
| 6,720,114 | B1* | 4/2004 | Winder et al. ................. 430/5 |
| 7,067,221 | B2 | 6/2006 | Mesuda et al. |
| 2003/0226819 | A1 | 12/2003 | Tzu et al. |
| 2003/0229879 | A1 | 12/2003 | Pierrat |
| 2004/0101766 | A1* | 5/2004 | Mesuda et al. ................. 430/5 |

(Continued)

FOREIGN PATENT DOCUMENTS

JP    63-293822    11/1988

(Continued)

OTHER PUBLICATIONS

Chinese Office Action issued on Mar. 20, 2009 in corresponding Chinese Patent Application 200580043248.5.

(Continued)

*Primary Examiner*—Mark F Huff
*Assistant Examiner*—Stewart A Fraser (57) ABSTRACT

A phase-shift mask including a transparent substrate, and a light-shielding film formed on the transparent substrate and provided with first apertures and second apertures which are alternately arranged. The transparent substrate is partially removed through the second apertures to form a recessed portion having a predetermined depth. Light transmitted through the first apertures and light transmitted through the second apertures are enabled to alternately invert in phase thereof. This phase-shift mask is characterized in that a phase shift of transmitted light is set in conformity with a pitch between an edge of the first aperture and an edge of the second aperture of the light-shielding film.

8 Claims, 9 Drawing Sheets

U.S. PATENT DOCUMENTS

2004/0248018 A1    12/2004    Kang et al.
2007/0037072 A1*    2/2007    Kojima et al. .................. 430/5

FOREIGN PATENT DOCUMENTS

| | | |
|---|---|---|
| JP | 5-11433 | 1/1993 |
| JP | 5-53290 | 3/1993 |
| JP | 7-306524 | 11/1995 |
| JP | 8-194303 | 7/1996 |
| JP | 8-314116 | 11/1996 |
| JP | 9-54420 | 2/1997 |
| JP | 9-80735 | 3/1997 |
| JP | 9-24410 | 9/1997 |
| JP | 9-244210 | 9/1997 |
| JP | 10-333316 | 12/1998 |
| JP | 2000-187315 | 7/2000 |
| JP | 3127148 | 11/2000 |
| JP | 2002-40624 | 2/2002 |
| JP | 2002-156741 | 5/2002 |
| JP | 2002-303966 | 10/2002 |
| JP | 2002-357889 | 12/2002 |
| JP | 2003-177511 | 6/2003 |
| JP | 2003-255511 | 9/2003 |
| JP | 2003-344987 | 12/2003 |
| KR | 10-0270588 | 8/2000 |

OTHER PUBLICATIONS

International Search Report of the International Published Application No. PCT/JP2005/022201 (mailed Mar. 7, 2006).
International Preliminary Report on Patentability, mailed Dec. 2, 2005 and issued in corresponding International Patent Application No. PCT/JP2005/022201.
Korean Office Action issued on Sep. 16, 2008 in corresponding Korean Patent Application No. 10-2007-7013338.
International Preliminary Report on Patentability, mailed Nov. 2, 2006, PCT/IB/338, 373 and PCT/ISA/237.
Office communication mailed from the U.S. Patent and Trademark Office on Feb. 5, 2009 in U.S. Appl. No. 11/583,797.
Notice of Allowance mailed from the U.S. Patent and Trademark Office on Aug. 5, 2009 in U.S. Appl. No. 11/583,797.

* cited by examiner

PHASE-SHIFT MASK, MANUFACTURING METHOD THEREOF AND MANUFACTURING METHOD OF SEMICONDUCTOR ELEMENT

CROSS REFERENCE TO RELATED APPLICATIONS

This is a Continuation Application of PCT Application No. PCT/JP2005/022201, filed Dec. 2, 2005, which was published under PCT Article 21(2) in Japanese.

This application is based upon and claims the benefit of priority from prior Japanese Patent Application No. 2004-363200, filed Dec. 15, 2004, the entire contents of which are incorporated herein by reference.

BACKGROUND OF THE INVENTION

1. Field of the Invention

This invention relates to a Levenson-type phase-shift mask, in particular to a Levenson-type phase-shift mask which is capable of minimizing the dimensional deviation of transferred pattern and of inhibiting the misregistration of transferred pattern.

2. Description of the Related Art

In recent years, concomitant with the trend to increasingly refine a semiconductor circuit pattern, there is also a surging trend to further refine the photomask to be employed in the formation of semiconductor circuit pattern. Therefore, it is now desired to enhance the resolution of the photomask. Under the circumstances, there has been proposed a so-called phase-shifting technique by Levenson et al. In this phase-shifting technique, the light is projected passing through neighboring apertures of the photomask in such a manner that it creates a phase shift of 180° between the neighboring apertures, thereby enhancing the resolution of the transferred pattern.

This phase-shifting technique is based on the principle that a phase-shifting portion is provided at one of the neighboring apertures, thereby enabling the light transmitted through this phase-shifting portion to take the opposite phase (a deviation of 180°) relative to another light transmitted through another aperture. As a result, these lights transmitting through the boundary portion of the transferred pattern are mutually weakened to separate the neighboring transferred patterned portions, thus making it possible to enhance the resolution of transferred pattern.

The photomask which is designed to cause the phase inversion of transmitting light through the phase-shifting portion at one of the neighboring apertures is generally called a Levenson-type phase-shift mask.

As for the Levenson-type phase-shift mask provided with a phase-shifting portion at one of the neighboring apertures, a dugout-type phase-shift mask wherein a phase shifter as well as a dugout portion (recessed portion) which is equivalent to the phase shifter is formed in a transparent substrate is frequently employed.

Figure 1:
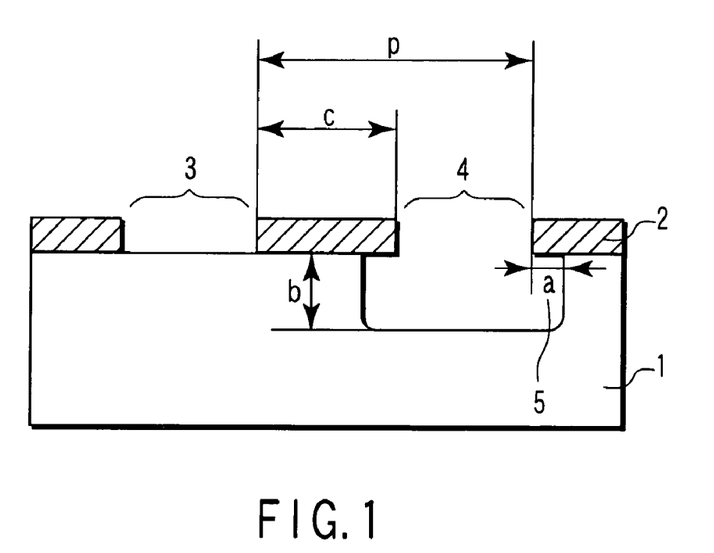
FIG. 1 is a cross-sectional view illustrating one model of a phase-shift mask.

FIG. 1 shows a cross-sectional view for illustrating the construction of the trench-type phase-shift mask. Referring to FIG. 1, a light-shielding film 2 is formed on the surface of a transparent substrate 1. In this light-shielding film 2, an aperture 3 exhibiting a phase shift of 0° (0-phase portion) and an aperture 4 exhibiting a phase shift of 180° (π-phase portion) are formed. A portion of the transparent substrate 1 where the aperture 4 is located is dug out in such a manner that undercut portions 5, each being over-hanged by the light-shielding film at a width of "a", are formed. The reference symbol "b" in FIG. 1 represents a phase shift, and the reference symbol "c" is called chrome CD (CD: Critical Dimension, which is a line width when a line pattern is an isolated pattern) and represents a dimension to be created when chromium is employed as the light-shielding film. The pitch "p" is a distance between an edge of one aperture of light-shielding pattern and an edge of the neighboring aperture of light-shielding pattern.

Although the undercut portions 5 is provided in order to prevent the generation of unbalance in exposure intensity that may be produced due to the transmitted light entering the side-wall of the trench of substrate in the case of the Levenson-type phase-shift mask having a single trench structure shown in FIG. 1 (for example, JP-A 08-194303), there is also known a structure wherein a space bias "s" is added to the original dimension of the aperture for the same purpose as described above as shown in FIG. 2 (for example, JP Patent No. 3127148 and JP-A 2003-255511).

However, the aforementioned Levenson-type phase-shift mask of trench type is accompanied with the following problems.

Figure 4:
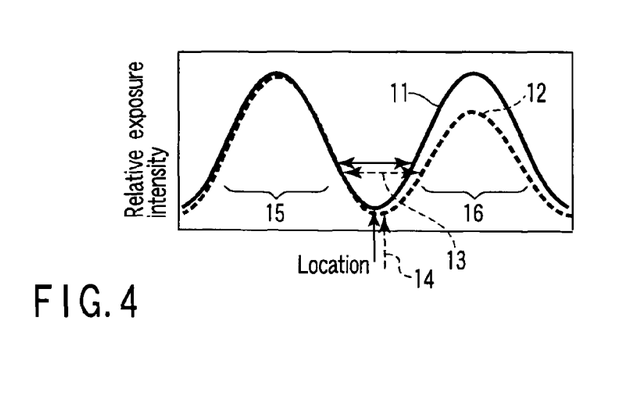
FIG. 4 is a graph showing the intensity of exposure for explaining the problems accompanied with the Levenson-type phase-shift mask.

Due to the non-uniformity in thickness of the resist film or due to the projected/recessed surface of the underlying layer, the deviation of focusing (hereinafter referred to as defocus or defocusing) on the occasion of exposure is produced. Further, since the fluctuation in contrast of the transmitted light at the 0-phase portion is caused to differ from that of the transmitted light at the π-phase portion due to the aforementioned defocus, the distribution of exposure intensity is brought into an unbalanced state as shown in the dotted line 12 of the graph of FIG. 4 illustrating the relationship between the exposure intensity and the location of phase portion. Namely, there are problems that the misregistration 14 of transferred pattern and the CD error 13 are produced. Further, the magnitude of misregistration of transferred pattern differs depending on the pitch of pattern. The solid line 11 in FIG. 4 represents a distribution of exposure intensity which is excellent in a state of balance. The reference number 15 in FIG. 4 denotes the exposure intensity at the 0-phase portion and the reference number 16 denotes the exposure intensity at the π-phase portion.

As for the measures to prevent the generation of misregistration of transferred pattern, there is known a technique wherein an original mask pattern is created based on a predetermined mask pattern data, and then, by making use of classified mask patterns, the magnitude of misregistration between each of the classified mask patterns and the original mask pattern is calculated to determine the correcting quantity of mask pattern for off-setting the magnitude of misregistration thus calculated. Then, based on the correcting quantity of mask pattern, the original mask pattern is corrected to obtain the final mask patter (JP-A 2002-357889).

However, this technique is designed to correct the size of pattern in taking measures against the misregistration of resist pattern that can be brought about due to the effects of waveguide. Namely, this technique is designed to correct the size of pattern so as to minimize the misregistration under the condition of best focusing, so that the misregistration due to the defocusing is required to be offset. Thus, although it is possible to minimize the average value of misregistration at a desired range of focusing width, it is impossible to sufficiently correct the misregistration of mask pattern since the range thereof is unchanged.

BRIEF SUMMARY OF THE INVENTION

An object of the present invention is to provide a phase-shift mask which makes it possible to obtain a pattern of high precision without generating misregistration even if defocusing is produced due to various magnitude of pitch.

Another object of the present invention is to provide a method of manufacturing the aforementioned phase-shift mask.

A further object of the present invention is to provide a method of manufacturing a semiconductor element wherein the aforementioned phase-shift mask is employed.

According to a first aspect of the present invention, there is provided a phase-shift mask comprising: a transparent substrate; and a light-shielding film formed on the transparent substrate and provided with first apertures and second apertures which are alternately arranged, the transparent substrate being partially removed through the second apertures to form a recessed portion having a predetermined depth; wherein light transmitted through the first apertures and light transmitted through the second apertures are enabled to alternately invert in phase thereof, and a phase shift of transmitted light is set in conformity with a pitch between an edge of the first aperture and an edge of the second aperture of the light-shielding film.

According to a second aspect of the present invention, there is provided a method of manufacturing a phase-shift mask, comprising: forming a light-shielding film on a transparent substrate; and forming first apertures and second apertures in the light-shielding film in such a manner that the first apertures and the second apertures are alternately arranged and that a recessed portion having a predetermined depth is formed in the transparent substrate in coincide with the second apertures, thereby enabling light transmitted through the first apertures and light transmitted through the second apertures to alternately invert in phase thereof; wherein a phase shift of transmitted light is set in accordance of a pitch between an edge of the first aperture and an edge of the second aperture of the light-shielding film.

According to a third aspect of the present invention, there is provided a method of manufacturing a semiconductor element, comprising: irradiating ultraviolet rays onto a resist film through the phase-shift mask claimed in claim 1; and developing the resist film irradiated with the ultraviolet rays to thereby form a resist pattern.

DETAILED DESCRIPTION OF THE INVENTION

Next, preferred embodiments for carrying out the present invention will be explained as follows.

The phase-shift mask according to a first embodiment of the present invention is provided with a transparent substrate; and a light-shielding film formed on the transparent substrate and having first apertures and second apertures which are alternately arranged. The transparent substrate is partially removed through the second apertures to form a recessed portion having a predetermined depth. Light transmitted through the first apertures and light transmitted through the second apertures are enabled to alternately invert in phase thereof. The phase-shift mask according to the first embodiment of the present invention is characterized in that a phase shift of transmitted light is set in conformity with a pitch between an edge of the first aperture and an edge of the second aperture of the light-shielding film.

According to the phase-shift mask as set forth according to the first embodiment of the present invention, since the phase shift of transmitted light is set in conformity with the pitch, even if the defocusing is generated, it is possible to form a pattern of high precision which is excellent in uniformity without generating misregistration while making it possible to secure a sufficient exposure intensity.

A method of manufacturing a phase-shift mask according to a second embodiment of the present invention comprises: forming a light-shielding film on a transparent substrate; and forming first apertures and second apertures in the light-shielding film in such a manner that the first apertures and the second apertures are alternately arranged and that a recessed portion having a predetermined depth is formed in the transparent substrate in coincide with the second apertures, thereby enabling light transmitted through the first apertures and light transmitted through the second apertures to alternately invert in phase thereof; wherein a phase shift of transmitted light is set in conformity with a pitch between an edge of the first aperture and an edge of the second aperture of the light-shielding film.

According to the method of manufacturing a phase-shift mask as set forth according to the first embodiment of the present invention, since the phase shift of transmitted light is set in conformity with the pitch, even if the defocusing is generated, it is possible to obtain a phase-shift mask which is capable of forming a pattern of high precision which is excellent in uniformity without generating misregistration while making it possible to secure a sufficient exposure intensity.

In the phase-shift mask according to the first aspect of the present invention as well as in the method of manufacturing the phase-shift mask according to the second aspect of the present invention, the phase shift of transmitted light can be set by adjusting dry etching conditions for etching the transparent substrate to a predetermined depth through the second apertures.

Further, the recessed portion can be formed by the etching of the transparent substrate through the second aperture under dry etching conditions which can be set up by a process comprising: (a) determining an optimum phase shift at each pitch based on optical conditions and on an extent of undercut extending from the recessed portion of the transparent substrate to below the light-shielding film and/or a bias from a set value of the width of the second aperture and of the width of the recessed portion, the optimum phase shift being converted into an etching depth to thereby calculate an optimum etching depth; (b) when the undercut is to be formed, subtracting the extent of the undercut from the etching depth which is derived from the conversion of the optimum phase shift to thereby calculate an optimum depth of dry etching; and (c) comparing the optimum depth of dry etching with data on the etching depth that can be obtained under a plurality of dry etching conditions to obtain a difference to thereby select dry etching conditions which enable the difference to become minimal.

In this case, the recessed portion can be formed by dry-etching the transparent substrate through the second aperture down to a depth which is shallower than the optimum depth of dry etching by a half of the minimal difference when the difference between the optimum depth of dry etching and the etching data where the difference is minimum is 1 nm or more.

Further, the phase shift can be adjusted by correcting the phase shift through the adjustment of dry etching time in conformity with the pitch.

Furthermore, the recessed portion can be formed by the etching of the transparent substrate through the second aperture under dry etching conditions which can be set up by a process comprising: (a) determining an optimum phase shift at each pitch based on optical conditions and on an extent of undercut extending from the recessed portion of the transparent substrate to below the light-shielding film and/or a bias from a set value of the width of the second aperture and of the width of the recessed portion, the optimum phase shift being converted into an etching depth to thereby calculate an optimum etching depth; (b) when the undercut is to be formed, subtracting the extent of the undercut from the etching depth which is derived from the conversion of the optimum phase shift to thereby calculate an optimum depth of dry etching; (c) classifying the pitch into a plurality of pitch portions differing in size according to the optimum depth of dry etching; and (d) repeating etching of the transparent substrate a plurality of times through the second aperture while changing the etching time for every pitch portion classified as described above.

The step of repeating etching of the transparent substrate a plurality of times while changing the etching time for every pitch portion classified depending on the difference in size can be performed, for example, by etching the transparent substrate in conformity with different optimum depth with a resist having an aperture corresponding to the second aperture of the light-shielding film being used as a mask.

The step of repeating etching of the transparent substrate a plurality of times while changing the etching time for every one of a plurality of pitch portions classified according to the difference of size can be performed, for example, by a process comprising the steps of: etching the transparent substrate through the second aperture of every pitch portions down to a minimal depth among the optimal dry etching depths; etching the transparent substrate to an optimum etching depth which is deeper than said minimal depth through the second aperture of every pitch portion which is not covered with the resist; said process being performed once or more until the depth of the recessed portion becomes the deepest optimal etching depth.

The method of manufacturing a semiconductor element according to the third aspect of the present invention comprises: irradiating ultraviolet rays onto a resist film through the aforementioned phase-shift mask; and developing the resist film irradiated with the ultraviolet rays to thereby form a resist pattern.

According to the method of manufacturing a semiconductor element according to the third aspect of the present invention which is formulated as described above, it is possible to realize a pattern exposure which is excellent in precision since the exposure is performed by making use of the aforementioned phase-shift mask. As a result, it is possible to manufacture a semiconductor element with high yield.

According to the phase-shift mask of the present invention, since the set-up of the phase shift is performed by adjusting the influence of defocus in conformity with the difference in size of pitches and on the basis of the data of pattern and the conditions of exposure, it is possible to secure a sufficient exposure intensity even if defocus is generated over a wide range of pitches and to obtain a uniform pattern of high precision without generating the misregistration.

According to the method of manufacturing a phase-shift mask as proposed by the present invention, it is possible to obtain a phase-shift mask which is excellent in precision and is capable of securing a sufficient exposure intensity and of obtaining a uniform pattern of high precision without generating misregistration.

According to the method of manufacturing a semiconductor element as proposed by the present invention, it is possible to realize a pattern exposure which is excellent in precision without generating misregistration since the exposure is performed by making use of the aforementioned phase-shift mask. As a result, it is possible to manufacture a semiconductor element with high yield.

Next, various embodiments of the present invention will be explained in detail with reference to drawings.

First of all, the method of manufacturing a phase-shift mask according to one embodiment of the present invention will be explained with reference to the flow chart of FIG. 3. The model of the Levenson-type phase-shift mask employed herein is formed of a single trench structure shown in FIG. 1 (Embodiment 2) and FIG. 2 (Embodiment 1). The following steps 1) to 7) in the following Embodiments 1 and 2 correspond respectively to the steps of S1 to S7 shown in FIG. 3.

Embodiment 1

Figure 2:
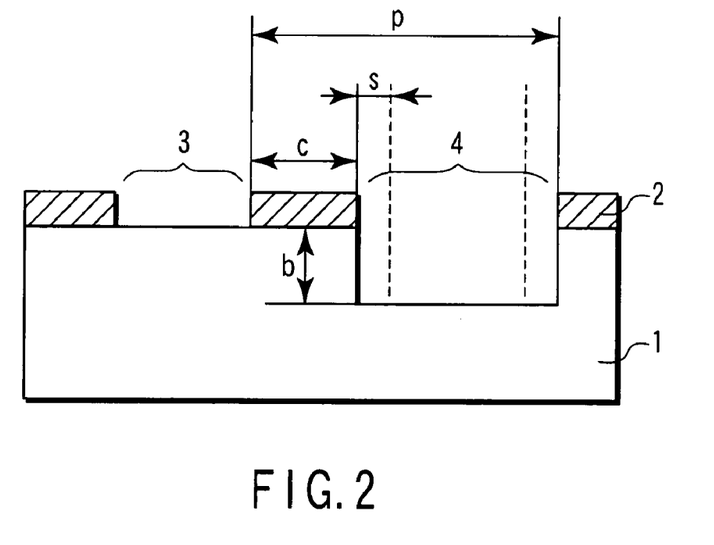
FIG. 2 is a cross-sectional view illustrating another model of a phase-shift mask.
Figure 3:
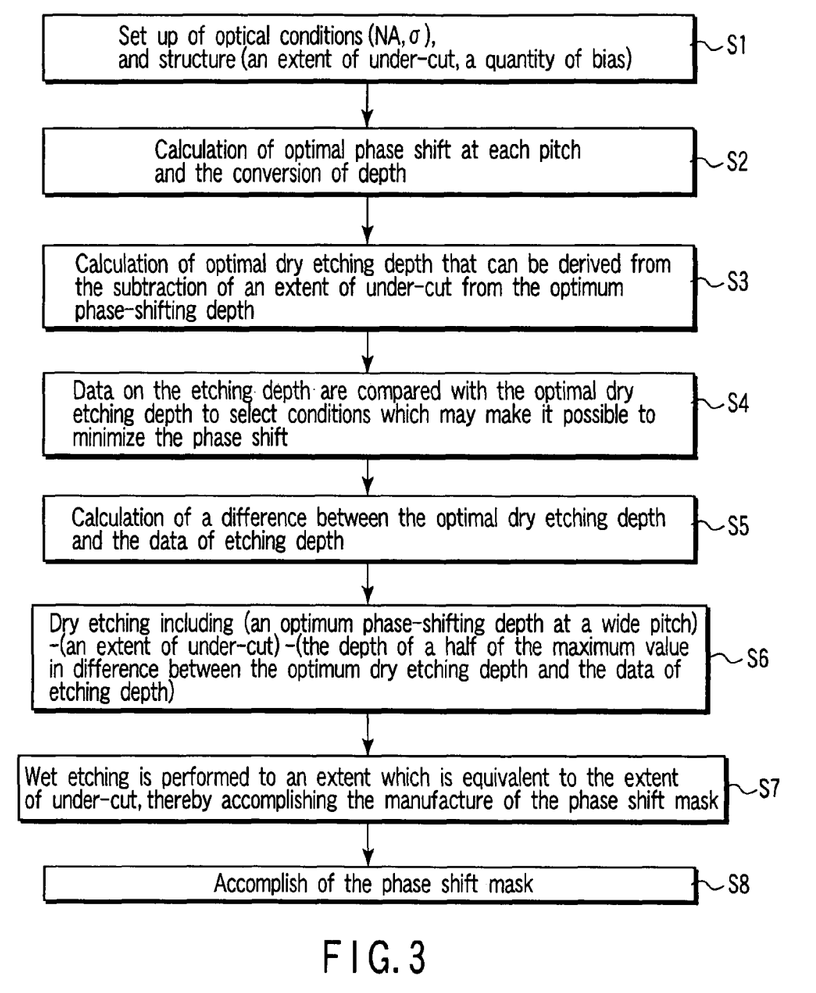
FIG. 3 is a flow chart illustrating the method of manufacturing a phase-shift mask according to one embodiment of the present invention.

As shown in FIG. 2, this embodiment illustrates the steps for manufacturing the phase-shift mask having a structure (π-space bias 80 nm (on a reticle); no undercut) wherein an undercut is not formed at the aperture and a difference of: (π–0)–CD (CD: Critical Dimension) at the moment of the best focusing is optimized by the provision of a bias "s" at the aperture. Incidentally, the difference of: (π–0)–CD is defined as follows: The size of the space on a wafer to be derived from an aperture exhibiting a phase shift of 180° (π-phase portion) which can be formed by etching a substrate is defined as π-CD, while the size of the space on a wafer to be derived from an aperture exhibiting a phase shift of 0° (0-phase portion) where the substrate is not etched is defined as 0–CD, and a difference between this couple of spaces is defined as a difference of: (π–0)–CD.

Step 1) (S1)

Set up of optical conditions (NA, σ), and structure (an extent of undercut, a quantity of bias) (S1):

First of all, optical conditions (NA, a), and structure (a quantity of undercut, a quantity of bias) are set up.

In the case of this embodiment, they are set up as follows.
Resist CD: 50 nm (on a wafer)
Exposure wavelength: 193 nm
NA: 0.7
σ: 0.4
Magnification of exposure: 4×
Extent of undercut: 0 nm
Quantity of π-space bias: 80 nm (on a reticle: both sides)

Incidentally, due to the optical proximity effects as the pitch becomes narrower, it becomes difficult to obtain the same resist dimension with the same quantity of exposure, so that the correction to the proximity effects is applied to the dimension of reticle.

Step 2) (S2)

Calculation of optimal phase shift at each pitch and the conversion of depth:

Since the dimension of reticle after the correction of the proximity effects is optimized as the best focusing according to the aforementioned method, there is little difference in (π–0)–CD and hence the intensity of transmitted light is identical with each other. However, when the focus is deviated, i.e. when the aforementioned defocusing is generated, the balance in intensity of exposure is lost, thus causing the difference of (π–0)–CD to fall out of the acceptable range. Accordingly, the difference of (n–0)–CD due to the defocusing is determined for each of the pitches.

Figure 5:
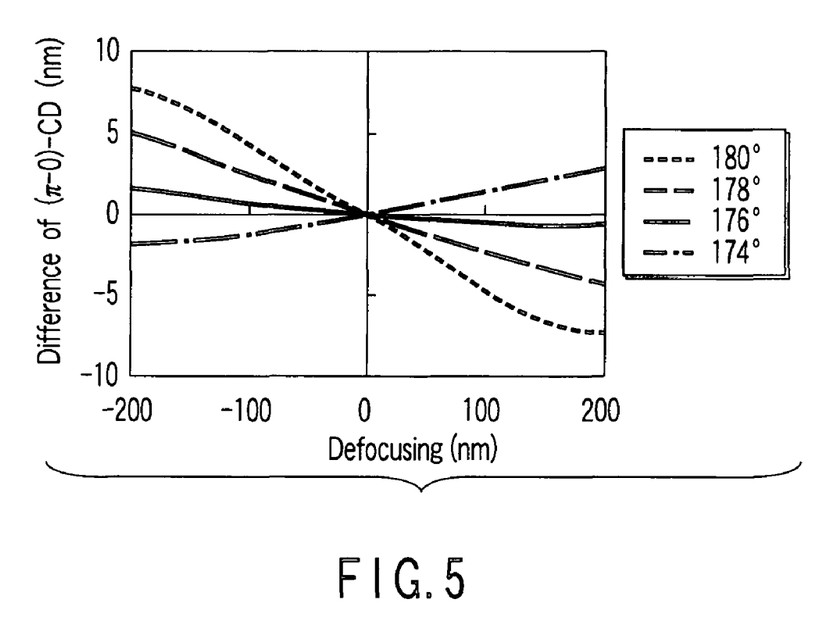
FIG. 5 is a graph showing $\pi$–0 CD difference generated when the focus and phase shift were fluctuated.

For example, in the case of the structure shown in FIG. 2 (π-space bias 80 nm (on a reticle) and no undercut), as seen from the graph of FIG. 5 showing the difference of (n–0)–CD due to the defocusing, if the phase shift is kept at 180° without correcting the phase shift at a pitch of 180 nm (on a wafer), the difference of (n–0)–CD is caused to fall out of the acceptable range (if the acceptable range is limited to ±5 nm) when the defocusing becomes close to ±100 nm, thus apparently raising a problem.

Therefore, in order to cope with this problem, it is required to change the phase shift to thereby adjust the difference of (π–0)–CD. FIG. 5 also shows the difference of (π–0)–CD when the phase shift is changed. In order to make the phase shift smaller than 180°, the depth of the aperture of π side is required to be made shallower. It will be seen from FIG. 5 that when the phase shift is adjusted to an intermediate value between 174° and 176°, i.e. 175°, the difference of (π–0)–CD would become almost zero even if the defocusing is generated. Namely, this 1750 is an optimum phase shift.

Likewise, an optimum phase shift is determined for each pitch, finding the trend that as the pitch becomes narrower, the optimum phase shift becomes smaller as compared with the case where the pitch is relatively wide. Further, even if the pitch is wide, the optimum phase shift can be made smaller than 180°, e.g. 179° in this embodiment.

Figure 7:
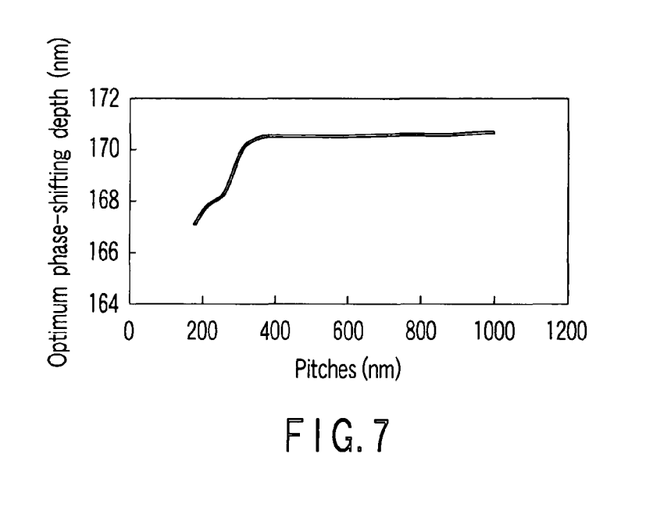
FIG. 7 is a graph showing a depth of optimal phase shift when the pitch was fluctuated.

Further, in order to take the magnitude of etching depth into consideration, the phase shift is converted into the depth. In this embodiment, if this conversion is performed assuming that 1° of phase shift corresponds to 0.953 nm of depth at an exposure wavelength of 193 nm, it is possible to obtain an optimum phase-shifting depth where the optimum phase shift is converted into the depth as shown in FIG. 7.

Step 3) (S3)

Calculation of optimal dry etching depth that can be derived from the subtraction of an extent of undercut from the optimum phase-shifting depth:

In the case of the structure of this embodiment, since there is no undercut, wet etching is not employed but only dry etching is employed. As a result, the optimum dry etching depth would become identical with the optimum phase-shifting depth.

Step 4) (S4)

Data on the etching depth are compared with the optimum dry etching depth to select conditions which may make it possible to minimize the phase shift.

Figure 8:
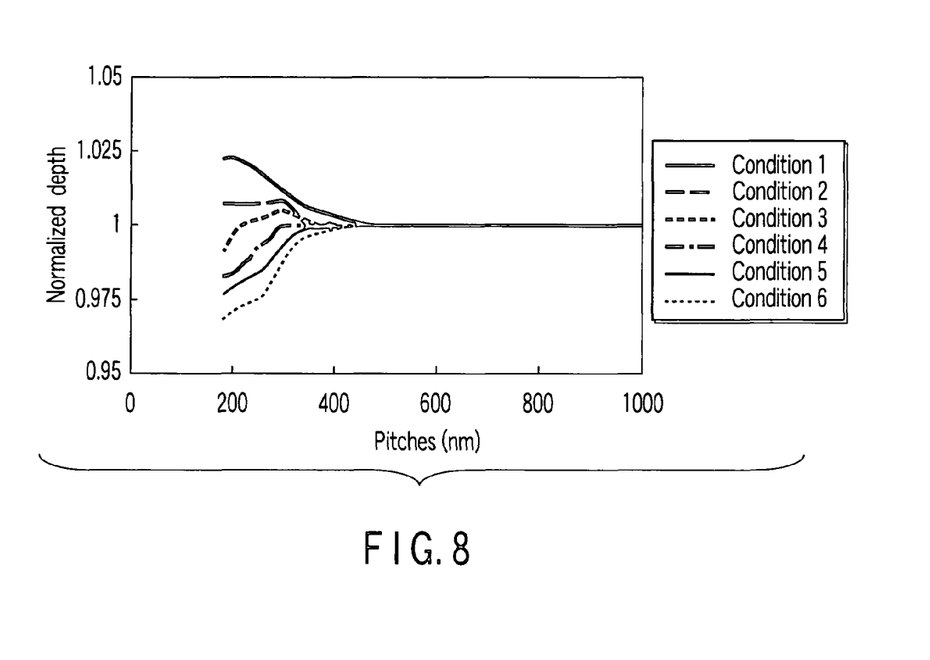
FIG. 8 is a graph showing a normalized depth when the pitch was fluctuated and the conditions of dry etching were changed.

FIG. 8 shows the relationship between the pitch and the normalized depth as the dry etching conditions were changed. The normalized depth can be obtained through a normalization wherein the optimum dry etching depth is divided by a depth obtained at a wide pitch (in this embodiment, 1000 nm pitch: on a wafer) to normalize the depth. As shown in FIG. 8, it is possible to adjust the etching depth by changing the dry etching conditions even in a case where the pattern includes a region varied in pitch such as a logic gate.

Figure 9:
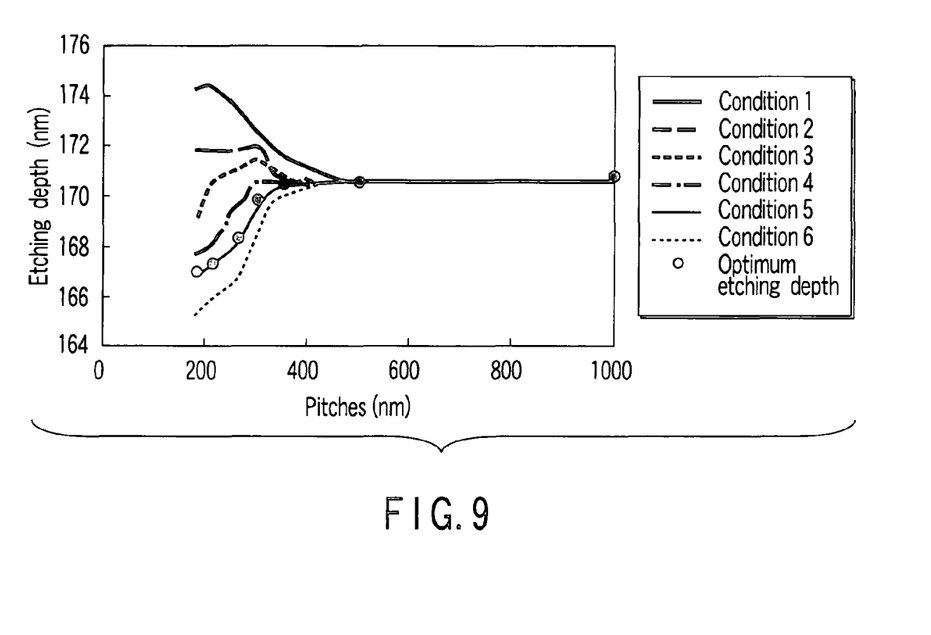
FIG. 9 is a graph showing the etching depth when the pitch was fluctuated and the conditions of dry etching were changed.

Therefore, for the purpose of comparison between the data on the etching depth under each etching condition and the optimum dry etching depth, the normalized etching depth shown in FIG. 8 is multiplied by 179 so as to adapt to the optimum phase shift at a wide pitch, thus facilitating the comparison of the data with the optimum dry etching depth as shown in FIG. 9. As shown in FIG. 9, since the condition 5 in the data of etching depth is most close to the result of the optimum dry etching depth, this condition 5 is adopted as an etching condition in this embodiment.

Incidentally, this etching condition includes a pressure, a discharging electric power, a bias electric power, kinds of etching gas, a flow rate of etching gas, etc.

Step 5) (S5)

Calculation of a difference between the optimal dry etching depth and the data of etching depth:

In the case of this embodiment, it will be recognized from FIG. 9 that the condition 5 makes it possible to create little difference between the optimal dry etching depth and the data of etching depth (the difference was less than 1 nm: in this embodiment, although this value was set up as a standard, the present invention is not limited to this value, but the difference may depend on the standard of the difference (π–0) at the defocusing).

Step 6) (S6)

Dry etching including (an optimum phase-shifting depth at a wide pitch)−(an extent of undercut)−(the depth of a half of the maximum value in difference between the optimum dry etching depth and the data of etching depth):

Therefore, in the case of this embodiment, since there is no undercut and the difference between the optimum dry etching depth and the data of etching depth is limited to less than 1 nm, the dry etching is performed under the condition 5 so as to create an optimum phase-shifting depth at a wide pitch, thereby enabling the phase shift at each pitch to become an optimum phase-shifting depth.

Step 7) (S7)

Wet etching is performed to an extent which is equivalent to the extent of undercut, thereby accomplishing the manufacture of the phase-shift mask:

In this embodiment, since there is no undercut, this step is not required to be performed.

Even if another structure (no space bias and undercut 100 nm: on reticle) is selected, the correction can be performed in the same manner as described above.

By being processed according to the aforementioned steps, the manufacture of the phase-shift mask is accomplished (S8).

Embodiment 2

This embodiment illustrates the steps for manufacturing the phase-shift mask having a structure (no space bias and an undercut of 100 nm) wherein an undercut is provided as shown in FIG. 1 to thereby optimize the difference of (π−0)−CD at the moment of the best focusing.

Step 1) (S1)

Set up of optical conditions (NA, a), and structure (an extent of undercut, a quantity of bias) (S1):

In the case of this embodiment, they are set up as follows.
Resist CD: 50 nm (on a wafer)
Exposure wavelength: 193 nm
NA: 0.7
π: 0.4
Magnification of exposure: 4×
Extent of undercut: 100 nm Quantity of π-space bias: 0 nm (on a reticle)

Incidentally, due to the optical proximity effects as the pitch becomes narrower, it becomes difficult to obtain the same resist dimension with the same quantity of exposure, so that the correction to the optical proximity effects is applied to the dimension of reticle.

Step 2) (S2)

Figure 6:
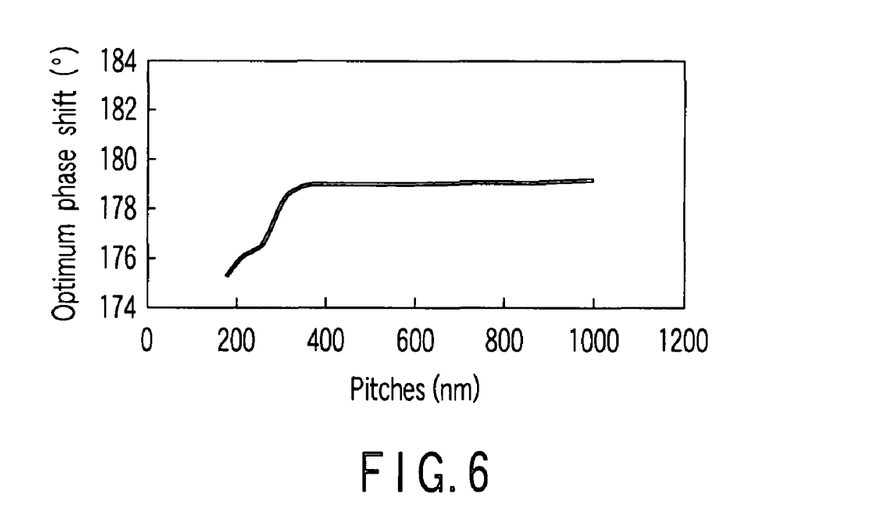
FIG. 6 is a graph showing an optimal phase shift when the pitch was fluctuated.

Calculation of optimal phase shift at each pitch and the conversion of depth:

The optimum phase shift at each pitch is calculated by means of simulation. In the embodiment, the results of the calculation were found identical with the results shown in FIG. 6. The optimum phase shift thus obtained is converted into the depth of etching in the same manner as described in Embodiment 1 to obtain the optimum phase-shifting depth as shown in FIG. 7.

Step 3) (S3)

Calculation of optimal dry etching depth that can be derived from the subtraction of an extent of undercut from the optimum phase-shifting depth:

Since the wet etching is isotropic etching, the etching is permitted to proceed in depth-wise to a distance of 100 nm. Therefore, the magnitude of depth to be dug out by means of dry etching would become one which is subtracted by the magnitude of depth to be executed by means of the wet etching. In this embodiment, a value that can be obtained by subtracting the magnitude of wet etching, i.e. 100 nm, from the optimum phase-shifting depth would become the optimum dry etching depth (see FIG. 8).

Step 4) (S4)

Data on the etching depth are compared with the optimum dry etching depth to select conditions which may make it possible to minimize the phase shift.

Figure 10:
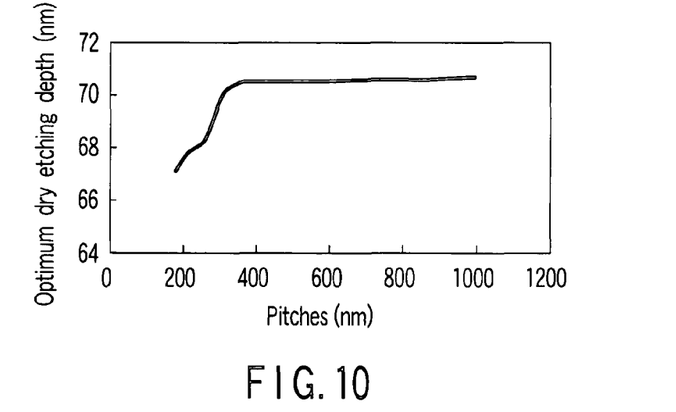
FIG. 10 is a graph showing an optimal depth of dry etching when the pitch was fluctuated.
Figure 11:
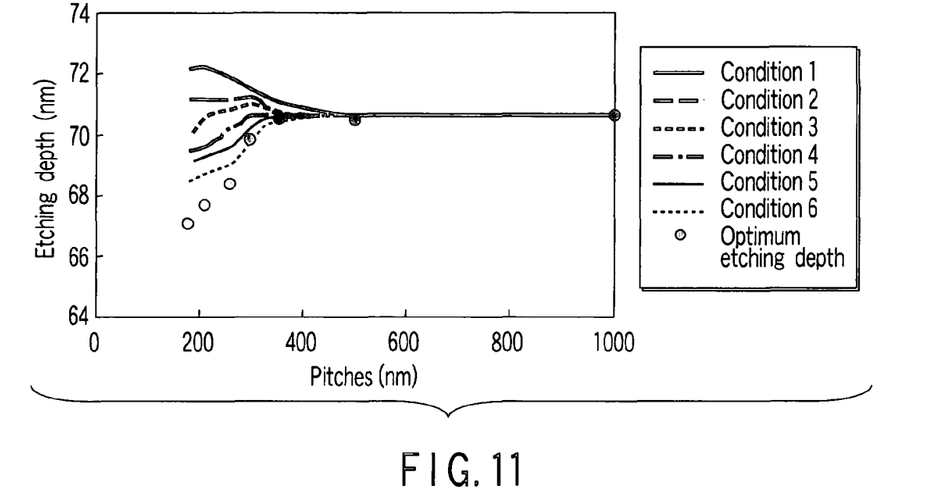
FIG. 11 is a graph showing the etching depth when the pitch was fluctuated and the conditions of dry etching were changed.

As in the case of Example 1, the normalized etching depth as shown in FIG. 8 is multiplied by a predetermined value so as to adapt to the optimum phase shift at a wide pitch as shown in FIG. 10, thus facilitating the comparison thereof (FIG. 11). In this embodiment, it will be recognized that the condition 6 tends to become close to the data of etching depth throughout the entire pitch.

Step 5) (S5)

Calculation of a difference between the optimal dry etching depth and the data of etching depth:

Referring to FIG. 11, a difference between the etching depth under the condition 6 and the optimal dry etching depth is determined. In the case of the mask structure of this embodiment, a difference of 1 nm or more at most is produced on a narrower pitch side in contrast to the mask structure of Embodiment 1.

Step 6) (S6)

Dry etching including (an optimum phase-shifting depth at a wide pitch)−(a quantity of undercut)−(the depth of a half of the maximum value in difference between the optimum dry etching depth and the data of etching depth):

Because of the difference between the optimum dry etching depth and the data of etching depth, a difference of (π−0)−CD is produced when defocusing is generated, so that it is required to adjust the phase shift as a whole. At an especially narrow pitch, the difference between the optimum dry etching depth and the data of etching depth is caused to increase and, therefore, in this embodiment, the difference between the optimum dry etching depth and the data of etching depth becomes 1.4 nm at a narrow pitch (a pitch of 180 nm: on a wafer) as shown in FIG. 11. When this difference is not adjusted, the difference of (π−0)−CD at a narrow pitch is caused to increase as defocusing is generated. On the other hand, when the etching depth at a narrow pitch is adjusted to become an optimum phase-shifting depth, the difference of (π−0)−CD at a wide pitch is caused to increase. Therefore, it is desired to adjust so as to minimize the difference of (π−0)−CD at a narrow pitch as well as a wide pitch. In the case of this embodiment, the etching depth is set up so as to make it shallower by a magnitude of 0.7 nm or a half of the maximum value of the difference between the optimum depth of dry etching and the etching data, thereby making it possible to minimize the difference of (π−0)−CD on the occasion when defocusing is generated.

Incidentally, if it is desired to minimize the difference of (π−0)−CD at a narrow pitch at the sacrifice of the difference of (π−0)−CD at a wide pitch, it can be extensively corrected by a magnitude of the depth which is close to the maximum value of the difference between the optimum depth of dry etching and the etching data.

Step 7) (S7)

Additional wet etching is performed to an extent which is equivalent to the extent of undercut, thereby accomplishing the manufacture of the phase-shift mask:

In this embodiment, since an undercut of 100 nm on one side is required, a wet etching of 100 nm is additionally performed, thereby accomplishing the manufacture of the phase-shift mask (S8).

Next, the manufacturing process of the phase-shift mask according to another embodiment of the present invention will be explained with reference to drawings.

Embodiment 3

Figure 12A:
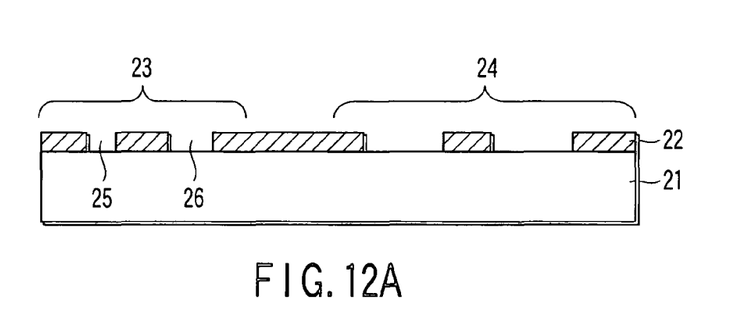
FIG. 12A is a cross-sectional view illustrating one step in the manufacturing process of the phase-shift mask according to another embodiment of the present invention.

First of all, as shown in FIG. 12A, by following the ordinary manufacturing step of binary mask, a chromium pattern 22 is formed on the surface of a transparent substrate 21. On the occasion, the etching of the chromium and the transparent substrate at a π-phase portion, after they are divided into aperture portions of 0° in phase shift (0-phase portions) and aperture portions of 180° in phase shift (π-phase portions), are not performed all at once. The reason for this is that, if they are divided into 0-phase portions and π-phase portions, these portions are required to be aligned with each other, but the accuracy thereof would fall beyond the acceptable range. Therefore, first of all, a chromium pattern is entirely formed. By doing so, it is possible to enable the chromium pattern to serve as an etching mask of the transparent substrate even if a resist pattern is misaligned more or less. The chromium pattern 22 includes a narrow pitch portion 23 and a wide pitch portion 24, wherein the narrow pitch portion 23 is provided with aperture portions of 0° in phase shift (0-phase portions) 25 and aperture portions of 180° in phase shift (π-phase portions) 26, while the wide pitch portion 24 is provided with aperture portions of 0° in phase shift (0-phase portions) 27 and aperture portions of 180° in phase shift (π-phase portions) 28. In this embodiment, depending on the optimum dry etching depth that has been determined according to the aforementioned method, these pitch portions are divided into two kinds of pitch portions differing in pitch. Although these pitch portions are divided into two kinds of pitch portions as a typical example in this embodiment, these pitch portions should preferably be divided into three or more kinds for the purpose of enhancing the precision.

Figure 12B:
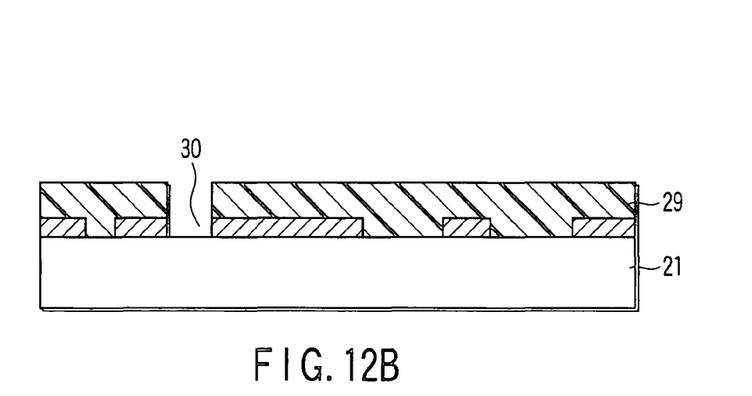
FIG. 12B is a cross-sectional view illustrating one step in the manufacturing process of the phase-shift mask according to another embodiment of the present invention.

Then, the working of the transparent substrate is performed. Although this working may be started from any kind of the pitch portions, this embodiment explains, as one example, the working which is started from a narrow pitch portion 23 which is also shallow in the optimum dry etching depth. Namely, as shown in FIG. 12B, a resist 29 is formed all over the surface and then an aperture 30 is formed at a resist portion which corresponds to the π-phase portion 26 of the narrow pitch portion 23.

Figure 12C:
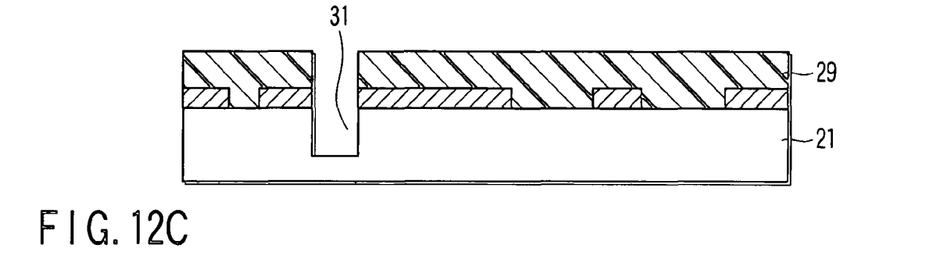
FIG. 12C is a cross-sectional view illustrating one step in the manufacturing process of the phase-shift mask according to another embodiment of the present invention.

Then, as shown in FIG. 12C, a region of the transparent substrate 21 exposed from the aperture 30 is worked by means of dry etching down to an optimum dry etching depth which creates an optimum phase shift at the narrow pitch, thereby forming an aperture 31.

Figure 12D:
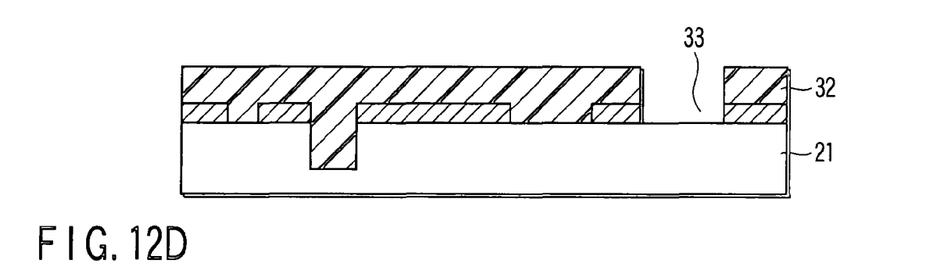
FIG. 12D is a cross-sectional view illustrating one step in the manufacturing process of the phase-shift mask according to another embodiment of the present invention.

Thereafter, after the resist 29 is peeled away, a resist 32 is newly formed to thereby fill the aperture 31 with the resist as shown in FIG. 12D. Then, an aperture 33 is formed only at a region of the resist 31 which corresponds to the π-phase portion 28 of the wide pitch portion 24.

Figure 12E:
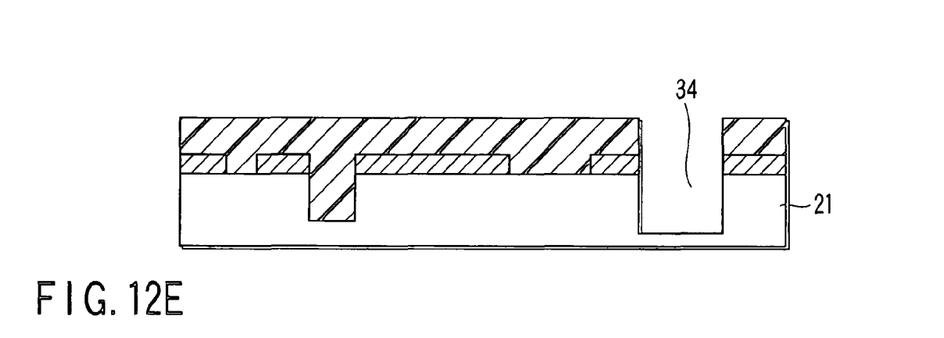
FIG. 12E is a cross-sectional view illustrating one step in the manufacturing process of the phase-shift mask according to another embodiment of the present invention.

Then, as shown in FIG. 12E, a region of the transparent substrate 21 exposed from the aperture 33 is worked by means of dry etching down to an optimum dry etching depth which creates an optimum phase shift at the wide pitch, thereby forming an aperture 34.

Figure 12F:
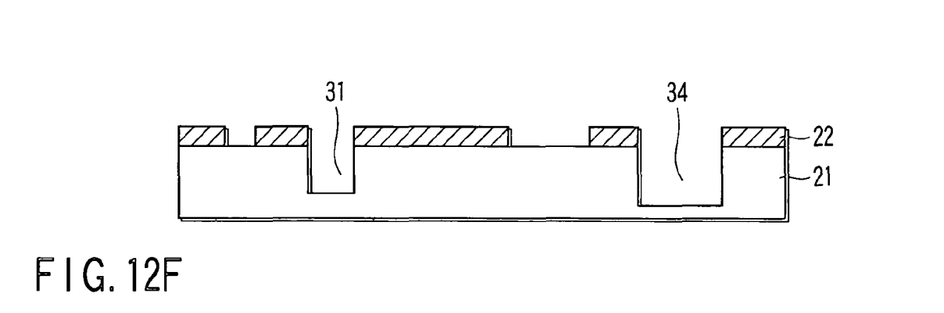
FIG. 12F is a cross-sectional view illustrating one step in the manufacturing process of the phase-shift mask according to another embodiment of the present invention.

Finally, as shown in FIG. 12F, the resist 32 is peeled away to accomplish a Levenson mask.

Incidentally, although the pitch portion is divided into two in this embodiment, if it is desired to divide the pitch portion into three of more, the aforementioned steps may be repeated.

Embodiment 4

Figure 13A:
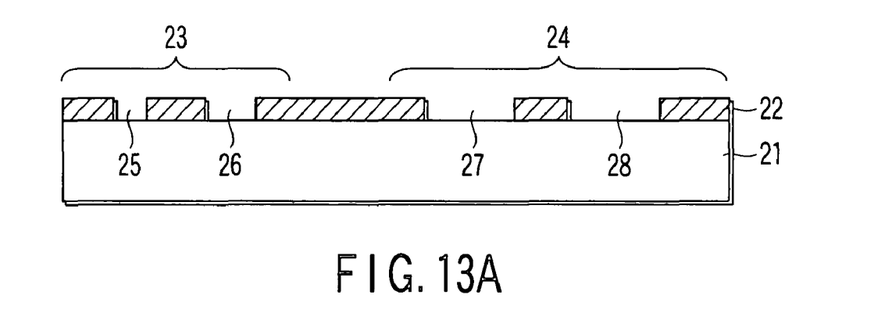
FIG. 13A is a cross-sectional view illustrating one step in the manufacturing process of the phase-shift mask according to a further embodiment of the present invention.

First of all, as shown in FIG. 13A, by following the ordinary manufacturing step of binary masking, a chromium pattern 22 is formed on the surface of a transparent substrate 21. The chromium pattern 22 includes a narrow pitch portion 23 and a wide pitch portion 24, wherein the narrow pitch portion 23 is provided with aperture portions of 0° in phase shift (0-phase portions) 25 and aperture portions of 180° in phase shift (π-phase portions) 26, while the wide pitch portion 24 is provided with aperture portions of 0° in phase shift (0-phase portions) 27 and aperture portions of 180° in phase shift (π-phase portions) 28. In this embodiment, these pitch portions are divided depending on the optimum dry etching depth that has been determined according to the aforementioned method. Although these pitch portions are divided into two kinds of pitch portions as a typical example in this embodiment, these pitch portions should preferably be divided into three or more kinds for the purpose of enhancing the precision.

Figure 13B:
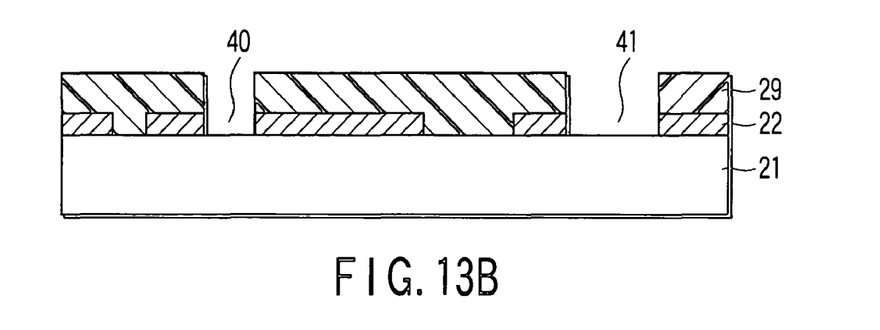
FIG. 13B is a cross-sectional view illustrating one step in the manufacturing process of the phase-shift mask according to a further embodiment of the present invention.

Then, as shown in FIG. 13B, a resist 29 is formed all over the surface and then apertures 40 and 41 are formed at a region of the resist 29 which corresponds to the π-phase portion 26 of the narrow pitch portion 23 and to the π-phase portion 28 of the wide pitch portion 24.

Figure 13C:
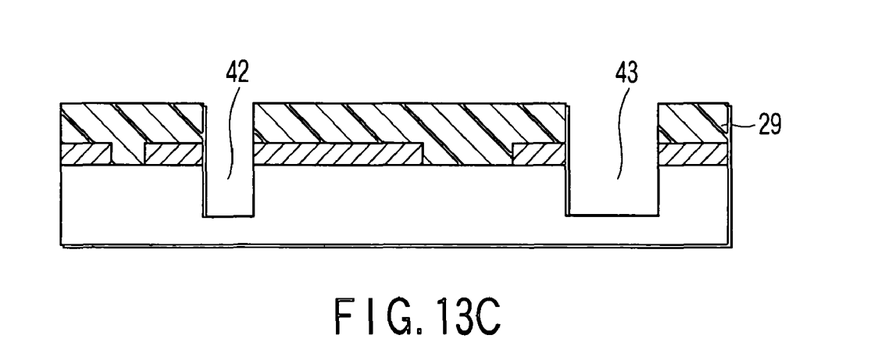
FIG. 13C is a cross-sectional view illustrating one step in the manufacturing process of the phase-shift mask according to a further embodiment of the present invention.

Then, as shown in FIG. 13C, a region of the transparent substrate 21 exposed from the apertures 40 and 41 is worked by means of dry etching down to an optimum dry etching depth which creates an optimum phase shift at the narrow pitch, thereby forming apertures 42 and 43.

Figure 13D:
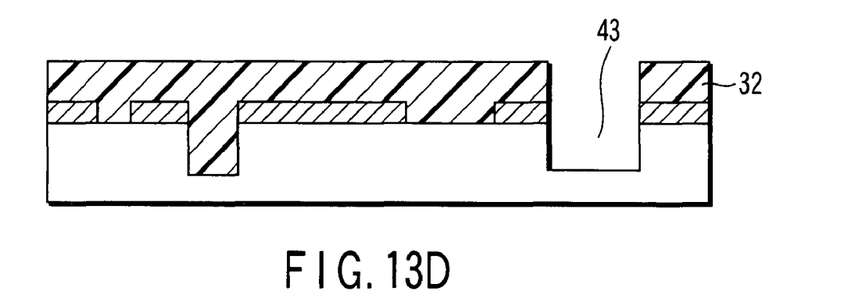
FIG. 13D is a cross-sectional view illustrating one step in the manufacturing process of the phase-shift mask according to a further embodiment of the present invention.

Thereafter, after the resist 29 is peeled away, a resist 32 is newly formed to thereby fill the apertures 42 and 43 with the resist as shown in FIG. 13D. Then, an aperture 43 is again formed at a region of the resist 32 which corresponds to the π-phase portion 28 of the wide pitch portion 24.

Figure 13E:
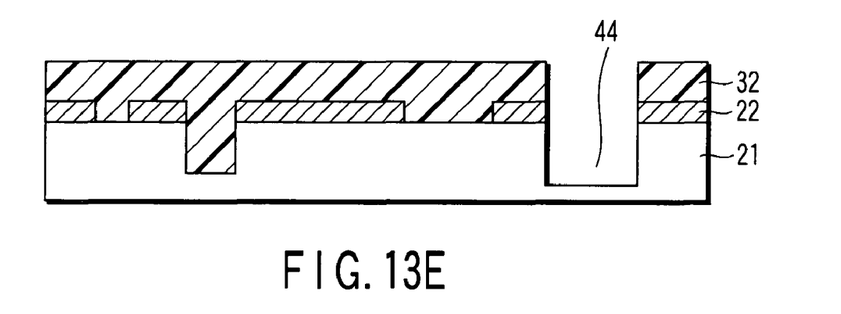
FIG. 13E is a cross-sectional view illustrating one step in the manufacturing process of the phase-shift mask according to a further embodiment of the present invention.

Then, as shown in FIG. 13E, the bottom portion of the aperture 43 is worked by means of dry etching down to an optimum dry etching depth which creates an optimum phase shift at the wide pitch, thereby forming an aperture 44.

Figure 13F:
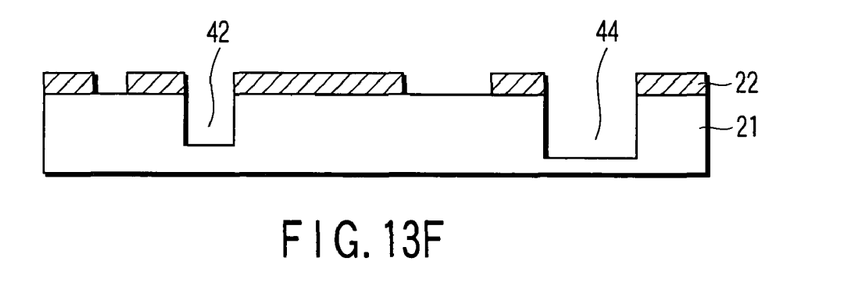
FIG. 13F is a cross-sectional view illustrating one step in the manufacturing process of the phase-shift mask according to a further embodiment of the present invention.

Finally, as shown in FIG. 13F, the resist 32 is peeled away to accomplish a Levenson mask.

Incidentally, although the pitch portion is divided into two in this embodiment, if it is desired to divide the pitch portion into three of more, the aforementioned steps may be repeated.

EXAMPLE

There will be explained one example to form the gate electrode of a logic device by making use of the phase-shift mask according to the aforementioned embodiment of the present invention.

An element isolation region was formed in advance and then a conductive layer to be used as a gate electrode material was formed on the surface of a silicon substrate having a gate oxide film formed on the surface of the active region thereof. Then, a resist was coated on this conductive layer. Then, based on a pattern data wherein the minimum dimension conditions on a wafer were set to 50 nm in resist CD and 180 nm in pitch, the Levenson-type phase-shift mask according to Embodiment 1 which was optimized as described above was manufactured.

Then, by making use of an exposure apparatus, the exposure to the resist was performed. The exposure conditions were as follows.

Exposure wavelength: 193 nm
NA: 0.7
σ: 0.4
Magnification of exposure: 4×

Subsequently, the resist was subjected to a developing treatment to form a resist pattern.

Then, by making use of this resist pattern as a mask, the conductive layer was subjected to reactive ion etching to form a gate electrode.

The gate electrode formed in this manner was found excellent in precision of pattern without misregistration.

Then, by following the same procedure as described in Embodiment 2, a Levenson-type phase-shift mask was manufactured. By making use of the phase-shift mask, exposure and development were performed to form a resist pattern, which was then used as a mask to perform the etching of the conductive layer by way of reactive ion etching. As a result, it was possible to obtain a gate electrode which was excellent in precision of pattern without misregistration.

This invention is widely useful as an exposure mask for the manufacture of a semiconductor element such as LSI, etc.

What is claimed is:

1. A method of manufacturing a phase-shift mask, comprising:

forming a light-shielding film on a transparent substrate: and forming first apertures and second apertures in the light-shielding film in such a manner that the first apertures and the second apertures are alternately arranged and that a recessed portion having a predetermined depth is formed in the transparent substrate in coincide with the second apertures, thereby enabling light transmitted through the first apertures and light transmitted through the second apertures to alternately invert in phase thereof;

wherein forming of the recessed portion is performed by the etching of the transparent substrate through the second aperture under dry etching conditions which, are set up by a process comprising: (a) determining an optimum phase shift at each pitch based on optical conditions and on an extent of undercut extending from the recessed portion of the transparent substrate to below the light-shielding film and/or a bias from a set value of the width of the second aperture and of the width of the recessed portion, the optimum phase shift being converted into an etching depth to thereby calculate an optimum etching depth; {b) when the undercut is to be formed, subtracting the extent of the undercut from the etching depth which Is derived from the conversion of the optimum phase shift to thereby calculate an optimum depth of dry etching; and (c) comparing the optimum depth of etching with data on the etching depth that can be obtained under a plurality of dry etching conditions to obtain a difference to thereby select dry etching conditions which enable the difference to become minimal, and a phase shift of transmitted light is set in accordance of a pitch between an edge of the first aperture and an edge of the second aperture of the light shielding film.

2. The method according to claim 1, wherein the phase shift of transmitted light is set by adjusting dry etching conditions for etching the transparent substrate to a predetermined depth through the second apertures.

3. The method according to claim 1, wherein forming of the recessed portion is performed by dry-etching the transparent substrate through the second aperture down to a depth which is shallower than the optimum depth of dry etching by a half of the minimal difference when the difference between the optimum depth of dry etching and the etching data where the difference is maximum is 1 nm or more.

4. The method according to claim 1, wherein the phase shift is adjusted by correcting the phase shift through the adjustment of dry etching time in conformity with the pitch.

5. A method manufacturing a phase-shift mask, comprising:

forming a light-shielding film on a transparent substrate; and forming first apertures and second apertures in the light-shielding film in such a manner that the first apertures and the second apertures are alternately arranged and that a recessed portion having a predetermined depth is formed in the transparent substrate in coincide with the second apertures, thereby enabling light transmitted through the first apertures and light transmitted through the second apertures to alternately invert in phase thereof;

wherein forming of the recessed portion is performed by the etching of the transparent substrate through the second aperture under dry etching conditions which are set up by a process comprising: (a) determining an optimum phase shift at each pitch based on optical conditions and on an extent of undercut extending from the recessed portion of the transparent substrate to below the light-shielding film and/or a bias from a set value of the width of the second aperture and of the width of the recessed portion, the optimum phase shift being converted Into an etching depth to thereby calculate an optimum etching depth; (b) when the undercut is to be formed, subtracting the extent of the undercut from the etching depth which is derived from the conversion of the optimum phase shift to thereby calculate an optimum depth of dry etching; (c) classifying the pitch into a plurality of pitch portions differing in size according to the optimum depth of dry etching; and (d) repeating etching of the transparent substrate a plurality of times through the second aperture while changing the etching time for every pitch portion classified, and a phase shift of transmitted limit is set in accordance of a pitch between an edge of the first aperture and an edge of the second aperture of the tight-shielding film.

6. The method according to claim 5, wherein repeating of etching of the transparent substrate a plurality of times while changing the etching time for every pitch portion classified Is performed by etching the transparent substrate in conformity with different optimum depth with a resist having an aperture corresponding to the second aperture of the light-shielding film being used as a mask.

7. The method according to claim 5, wherein repeating of etching of the transparent substrate a plurality of times while changing the etching time for every one of a plurality of pitch portions classified according to the difference of size is performed by a process comprising: etching the transparent substrate through the second aperture of every pitch portions down to a minimal depth among the optimal dry etching depths; etching the transparent substrate to an optimum etching depth which is deeper than said minimal depth through the second aperture of every pitch portion which is not covered with the resist; and said process being performed once or more until the depth of the recessed portion becomes the deepest optimal etching depth.

8. A method of manufacturing a semiconductor element, comprising: irradiating ultraviolet rays onto a resist film through the phase-shift mask claimed in claim 5; and developing the resist film irradiated with the ultraviolet rays to thereby form a resist pattern.

* * * * *

UNITED STATES PATENT AND TRADEMARK OFFICE
CERTIFICATE OF CORRECTION

PATENT NO.         : 7,754,397 B2
APPLICATION NO.    : 11/812062
DATED              : July 13, 2010
INVENTOR(S)        : Toshio Konishi et al.

It is certified that error appears in the above-identified patent and that said Letters Patent is hereby corrected as shown below:

Column 13, Line 52 delete "{b)" and insert --(b)--.

Column 13, Line 54 delete "Is" and insert --is--.

Column 14, Line 36 delete "Into" and insert --into--.

Column 14, Line 51 delete "tight" and insert --light--.

Column 14, Line 54 delete "Is" and insert --is--.

Signed and Sealed this
Seventh Day of June, 2011

David J. Kappos
*Director of the United States Patent and Trademark Office*